United States Patent
Hammarqvist

(10) Patent No.: US 9,437,210 B2
(45) Date of Patent: Sep. 6, 2016

(54) AUDIO SIGNAL PROCESSING

(71) Applicant: Microsoft Technology Licensing, LLC, Redmond, WA (US)

(72) Inventor: Ulf Nils Hammarqvist, Stockholm (SE)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/459,263

(22) Filed: Aug. 13, 2014

(65) Prior Publication Data

US 2015/0294675 A1 Oct. 15, 2015

(30) Foreign Application Priority Data

Apr. 11, 2014 (GB) .................................. 1406574.2

(51) Int. Cl.
| | |
|---|---|
| G10L 19/00 | (2013.01) |
| H04M 9/08 | (2006.01) |
| H04M 9/00 | (2006.01) |
| H04M 1/00 | (2006.01) |
| H03G 3/20 | (2006.01) |
| H04R 5/00 | (2006.01) |
| H04R 25/00 | (2006.01) |
| H04B 3/20 | (2006.01) |
| H03G 3/00 | (2006.01) |

(Continued)

(52) U.S. Cl.
CPC ........... *G10L 21/0208* (2013.01); *G06F 3/162* (2013.01); *H04R 3/02* (2013.01); *H04R 3/04* (2013.01); *G06F 3/16* (2013.01); *G10L 21/0364* (2013.01); *G10L 2021/02082* (2013.01); *H04M 9/082* (2013.01); *H04R 27/00* (2013.01); *H04R 2201/107* (2013.01); *H04R 2227/003* (2013.01)

(58) Field of Classification Search
CPC .... H04B 3/23; H04M 1/6033; H04M 9/082; H03G 3/32; H03G 3/001; H04R 25/552; H03F 1/3247; H04L 25/0008
See application file for complete search history.

(56) References Cited

U.S. PATENT DOCUMENTS 5,479,522 A * 12/1995 Lindemann .......... H04R 25/356
381/23.1
6,317,613 B1 * 11/2001 Brown, Jr. ............. H04B 1/082
370/202

(Continued)

OTHER PUBLICATIONS

"International Search Report and Written Opinion", Application No. PCT/US2015/024412, Jun. 19, 2015, 11 pages.

(Continued)

*Primary Examiner* — Pierre-Louis Desir
*Assistant Examiner* — Anne Thomas-Homescu
(74) *Attorney, Agent, or Firm* — Tom Wong; Micky Minhas

(57) ABSTRACT

Disclosed is a device having an audio interface configured to generate from the audio signal an outgoing audio signal for supplying to a loudspeaker component. The audio interface is configured, in generating the outgoing audio signal, to apply dynamic range compression to the audio signal. Device software is configured to receive an incoming audio signal and generate an audio signal from the incoming audio signal. The audio signal generated by the software is supplied to the audio interface for outputting by the loudspeaker component and is also used as a reference in audio signal processing. Generating the audio signal comprises the software applying initial nonlinear amplitude processing to the incoming audio signal to modify its power envelope. The modified power envelope is sufficiently smooth to be substantially unaffected by the dynamic range compression when applied by the audio interface.

20 Claims, 10 Drawing Sheets

(51) Int. Cl.
*H03C 3/00* (2006.01)
*H03K 7/06* (2006.01)
*H04L 27/12* (2006.01)
*G10L 21/0208* (2013.01)
*H04R 3/04* (2006.01)
*G06F 3/16* (2006.01)
*H04R 3/02* (2006.01)
*H04K 1/02* (2006.01)
*H04L 25/03* (2006.01)
*H04L 25/49* (2006.01)
*H04R 27/00* (2006.01)
*G10L 21/0364* (2013.01)

(56) References Cited

U.S. PATENT DOCUMENTS

| | | | | |
|---|---|---|---|---|
| 6,675,125 B2 * | 1/2004 | Bizjak | ............... | H03G 3/3089 333/14 |
| 8,660,676 B2 * | 2/2014 | Aichner | ............... | H04M 9/082 700/94 |
| 8,964,998 B1 * | 2/2015 | McClain | ............... | H03G 3/32 381/106 |
| 9,042,561 B2 * | 5/2015 | Gautama | ............... | H04R 3/007 381/55 |
| 2004/0052358 A1 * | 3/2004 | Lashley | ............... | H04B 3/23 379/387.01 |
| 2010/0166225 A1 * | 7/2010 | Watanabe | ............... | H03G 3/32 381/107 |
| 2010/0183093 A1 * | 7/2010 | Ghannouchi | ............... | H03F 3/217 375/302 |
| 2011/0093102 A1 * | 4/2011 | Aichner | ............... | H04M 9/082 700/94 |
| 2013/0251167 A1 * | 9/2013 | Gautama | ............... | H04B 3/23 381/66 |
| 2013/0268278 A1 * | 10/2013 | Li | ............... | G10L 19/00 704/500 |
| 2014/0023208 A1 * | 1/2014 | Oh | ............... | H03F 3/217 381/107 |
| 2014/0105327 A1 * | 4/2014 | Geng | ............... | H03F 1/025 375/297 |
| 2014/0191798 A1 * | 7/2014 | Lozhkin | ............... | H03F 1/3258 330/149 |
| 2014/0211886 A1 * | 7/2014 | Ghannouchi | ............... | H04B 1/0475 375/297 |
| 2015/0154977 A1 * | 6/2015 | Ekman | ............... | H04M 9/082 381/66 |
| 2015/0229353 A1 * | 8/2015 | Berthelsen | ............... | H04B 3/23 379/406.08 |
| 2015/0249884 A1 * | 9/2015 | Ooi | ............... | H04R 3/002 381/66 |

OTHER PUBLICATIONS

Second Written Opinion, Application No. PCT/US2015/024412, Mar. 16, 2016, 5 pages.
International Preliminary Report on Patentability, Application No. PCT/US2015/024412, Jun. 13, 2016, 7 pages.

* cited by examiner

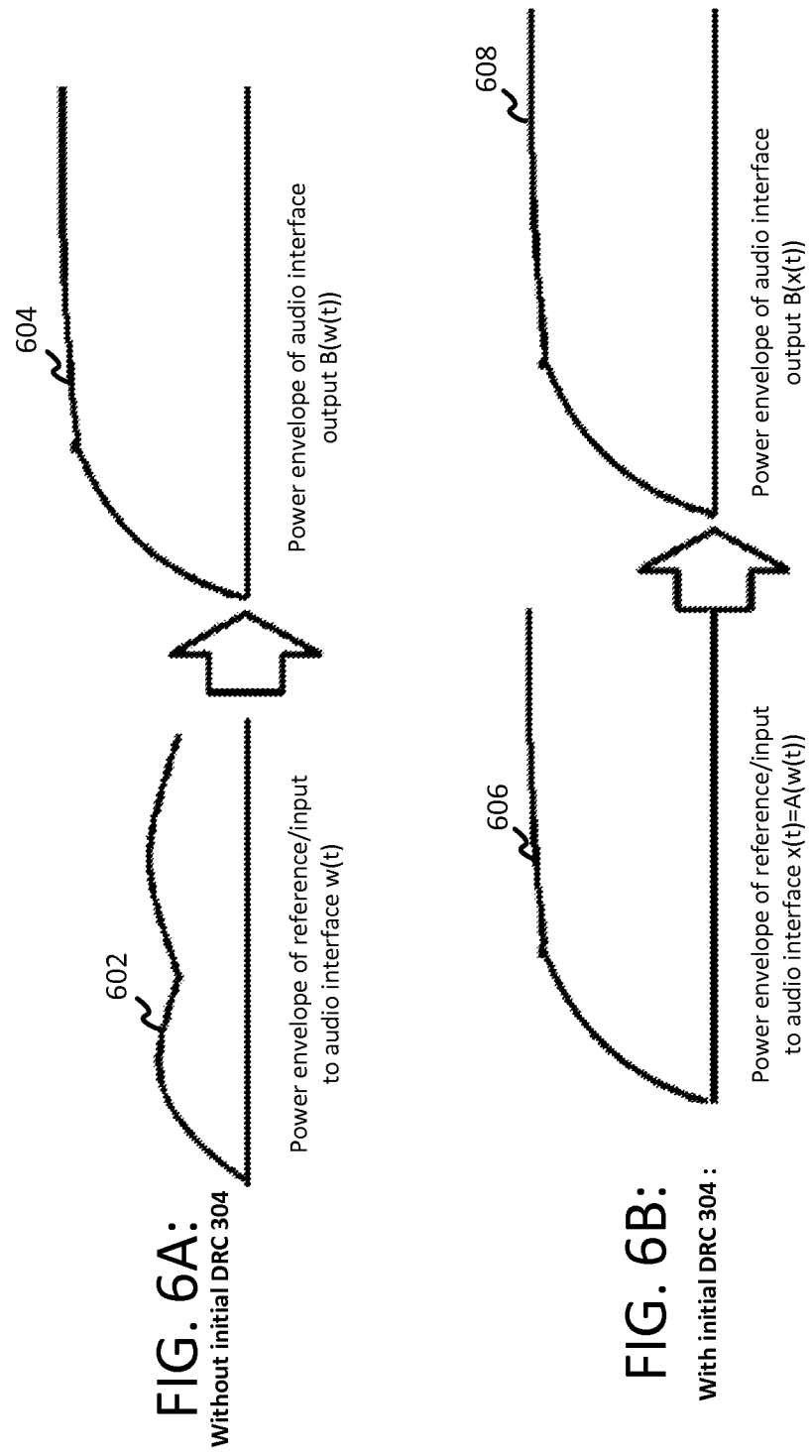

AUDIO SIGNAL PROCESSING

RELATED APPLICATIONS

This application claims priority under 35 USC §119 or §365 to Great Britain Patent Application No. 1406574.2 entitled "Audio Signal Processing" filed Apr. 11, 2014, the disclosure of which is incorporate in its entirety.

BACKGROUND

Communication systems allow users to communicate with each other over a network. The network may be, for example, the Internet or public switched telephone network (PSTN). Audio signals can be transmitted between nodes of the network, to thereby allow users to transmit and receive audio data (such as speech data) to each other in a communication session over the communication system.

A user device may have audio input means such as a microphone that can be used to receive audio signals such as speech from a user. The user may enter into a communication session with another user, such as a private call (with just two users in the call) or a conference call (with more than two users in the call). The user's speech is received at the microphone, processed and is then transmitted over a network to the other users in the call. The user device may also have audio output means such as speakers for outputting audio signals to the near-end user that are received over the network from a far-end user during a call. Such speakers can also be used to output audio signals from other applications which are executed at the user device, and which can be picked up by the microphone as unwanted audio signals which would disturb the speech signals from the near-end user.

As well as the audio signals from the user, the microphone may also receive other audio signals, such as background noise, which are unwanted and which may disturb the audio signals received from the user. The background noise can contribute to disturbance to the audio signal received at the microphone from the near-end user for transmission in the call to a far-end user.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Disclosed is an audio signal processing device having a loudspeaker component for outputting analogue audio signals and a microphone component for receiving analogue audio signals. The device comprises an audio interface. The audio interface is configured to receive in digital form any audio signal generated on the device for outputting via the loudspeaker component and to generate from the audio signal an outgoing audio signal in analogue form for supplying to the loudspeaker component. The audio interface is configured, in generating the outgoing audio signal, to apply dynamic range compression to the audio signal. The device further comprises a processor configured to execute software. The software is configured to receive an incoming audio signal and generate from the incoming audio signal an audio signal in digital form. The audio signal generated by the software is supplied to the audio interface for outputting by the loudspeaker component and is used as a reference in audio signal processing of audio signals received via the microphone component.

Generating the audio signal comprises the software applying initial nonlinear amplitude processing to the incoming audio signal to modify its power envelope, the audio signal thereby having a modified power envelope. The modified power envelope of the audio signal is sufficiently smooth to be substantially unaffected by the dynamic range compression when applied to the audio signal by the audio interface.

BRIEF DESCRIPTION OF FIGURES

To aid understanding of the present subject matter and to show how the same may be put into effect, reference will now be made, by way of example, to the following drawings in which:

FIGS. 6A and 6B are schematic comparisons of audio signal power envelopes;

DETAILED DESCRIPTION

Embodiments will now be described by way of example only.

Figure 1:
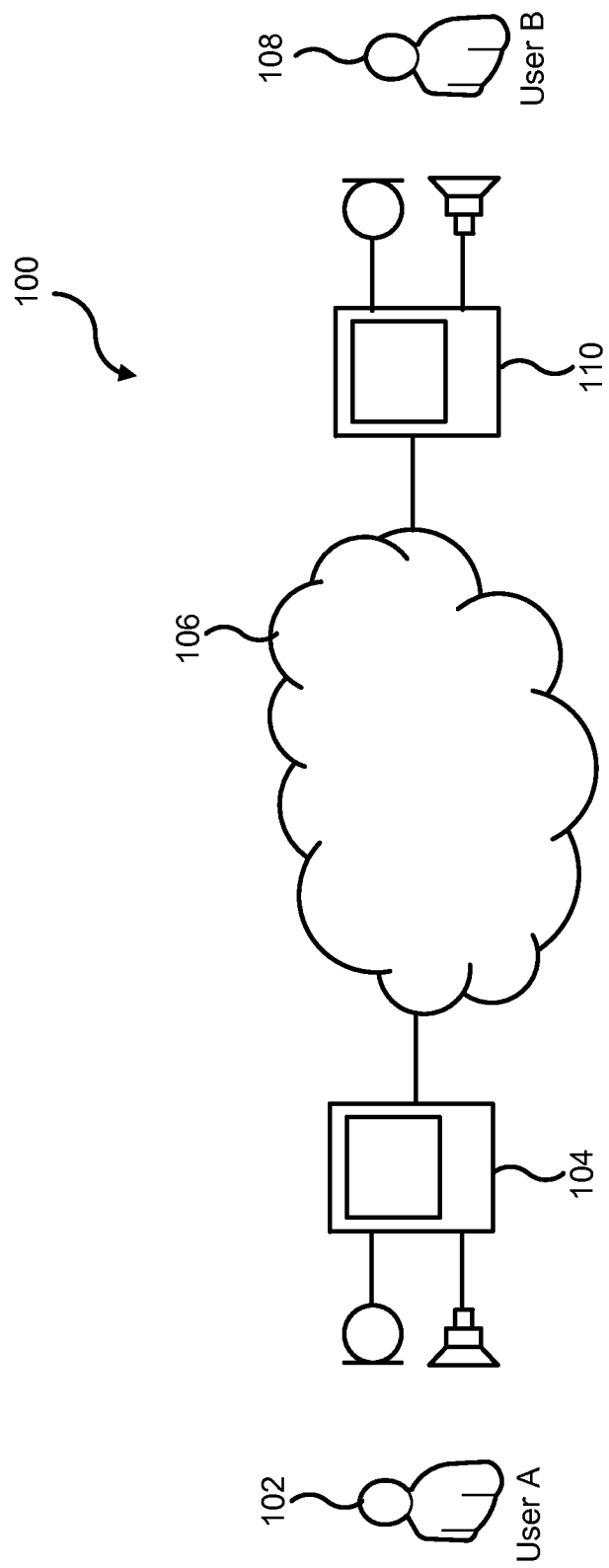
FIG. 1 shows a schematic illustration of a communication system.

FIG. 1 shows a communication system 100 comprising a first user 102 ("User A") who is associated with a first user device 104 and a second user 108 ("User B") who is associated with a second user device 110. In other embodiments the communication system 100 may comprise any number of users and associated user devices. The user devices 104 and 110 can communicate over the network 106 in the communication system 100, thereby allowing the users 102 and 108 to communicate with each other over the network 106. The communication system 100 shown in FIG. 1 is a packet-based communication system, but other types of communication system could be used. The network 106 may, for example, be the Internet. Each of the user devices 104 and 110 may be, for example, a mobile phone, a tablet, a laptop, a personal computer ("PC") (including, for example, Windows™, Mac OS™ and Linux™ PCs), a gaming device, a television, a personal digital assistant ("PDA") or other embedded device able to connect to the network 106. The user device 104 is arranged to receive information from and output information to the user 108 of the user device 110. The user device 104 comprises output means such as a display and speakers. The user device 104 also comprises input means such as a keypad, a touch-screen, a microphone for receiving audio signals and/or a camera for capturing images of a video signal. The user device 104 is connected to the network 106.

The user device 104 executes an instance of a communication client, provided by a software provider associated with the communication system 100. The communication client is a software program executed on a local processor in the user device 104. The client performs the processing required at the user device 104 in order for the user device 104 to transmit and receive data over the communication system 100.

The user device 110 corresponds to the user device 104 and executes, on a local processor, a communication client which corresponds to the communication client executed at the user device 104. The client at the user device 110 performs the processing required to allow the user 108 to communicate over the network 106 in the same way that the client at the user device 104 performs the processing required to allow the user 102 to communicate over the network 106. The user devices 104 and 110 are endpoints in the communication system 100. FIG. 1 shows only two users (102 and 108) and two user devices (104 and 110) for clarity, but many more users and user devices may be included in the communication system 100, and may communicate over the communication system 100 using respective communication clients executed on their respective user devices.

Devices typically have a dedicated audio signal processing module (such as a sound card) in addition to a local processor on the device. This audio signal processing module performs audio processing functions for the user device such as analogue to digital conversion (ADC) of audio signals captured at a microphone and digital to analogue conversion (DAC) of audio signals for playing out of a speaker. To use the audio signal processing module an operating system (OS) executed on the local processor on the device typically requires specific software. For example, to use a sound card, an OS typically requires a specific sound card driver (a software program that handles the data connections between the physical hardware of the sound card and the operating system).

The soundcard hardware and sound card driver software constitute an example of an "audio interface" as used herein. In general, an audio interface is a component (e.g. software, hardware or a combination of both) of a device (e.g. user devices 104, 110) configured to receive in digital form any audio signal generated on that device for outputting via a loudspeaker component and to generate from the audio signal an outgoing audio signal in analogue form for supplying to the loudspeaker component.

It is common that the audio interface (that is, the driver software and/or the hardware itself) introduce effects on the play out signal (i.e. the signal to be output from a speaker) in order to maximize the user experience (e.g. loudness enhancement effects included in the drivers and/or hardware). Those effects are achieved by signal processing modules of the audio interface, the functionality of which is outside of the control of, and which may be unknown to, applications (e.g. a communication client) executed on a local processor on the device that use the play out system available in the OS. For instance, it is common that hardware manufacturers include "dynamic range compression" (for example, maximization to maximize perceived loudness for a given peak signal level) in loudspeakers setups, e.g. in laptops, smartphones, tablet devices etc.

Dynamic range compression (otherwise referred to as dynamic compression or simply compression) reduces the volume of loud sounds or amplifies the volume of quiet sounds by narrowing or "compressing" an audio signal's dynamic range (e.g. to make quite parts more audible and/or prevent loud parts from being excessively loud). Downward compression reduces loud sounds over a certain threshold while quiet sounds remain unaffected, whilst upward compression increases the loudness of sounds below a threshold while leaving louder passages unchanged. Both downward and upward compression reduce the dynamic range of an audio signal.

In general, the disclosure considers an audio interface configured, in generating an outgoing audio signal from a supplied audio signal, to apply dynamic range compression to that audio signal. Use of such compression is meant to enhance the user experience e.g. as the user is able to perceive a louder sound.

Both the first user device 104 and a second user device 110 may perform acoustic echo cancellation. There are two main ways to achieve acoustic echo cancellation, one being echo subtraction and the other being echo suppression. Often these two approaches are combined.

The audio signal captured by the microphone of the first user device 104 is transmitted over the network 106 for playing out by the second user device 110. The microphone of the second user device 110 captures an echo of the audio signal that was transmitted by the first user device 104. If that echo is not fully cancelled, then the second user device 110 transmits it back to the first user device 104. That received signal is played-out through the speakers of the first user device 104, and an echo is captured by the microphone of the first user device 104. If the echo canceller in the first user device 104 is not able to completely remove that echo, the echo signal is transmitted again to the second user device 110.

Echo cancellation typically makes use of a reference, which is typically some version of an audio signal before it is supplied to the loudspeaker, tapped from a point in a chain of audio signal processing before the loudspeaker, and models an echo path observed by that version of the audio signal. That echo path includes not only the air interface between the loudspeaker and the microphone, but also any subsequent signal processing applied to that version of the audio signal after the point at which it is tapped and which is thus not reflected in the reference.

In general, when a reference is sought in the output of a device play out (for echo cancellation or some other reference-based signal processing), it can be problematic if the device applies unknown non-linear processing that is not reflected in the reference.

For instance, traditional echo cancellers are better suited to modelling linear distortions in the echo path and generally have problems accounting for nonlinear distortions that are present in the echo path. Such nonlinear echo paths can lead to echo leaks or echo residuals in the signal. That is, traditional echo cancellers typically perform best when there is a substantially linear relationship between the reference and the echo component picked up in the microphone signal.

However, when dynamic range compression is used in the audio interface of a communication device, it may introduce a nonlinearity in the echo path. This creates challenges for echo cancelers as the dynamic range compression constitutes nonlinear amplitude processing that is poorly modeled by traditional echo cancellation schemes, as discussed.

Some operating systems include functionality for feeding back the signal that is going to be played out to the application executed on the local processor. This signal that is fed back to the application executed on the local processor is referred to herein after as a "loopback signal". The loopback signal can then be used as a reference in the echo cancellation procedure. Examples of operating systems including this functionality are Microsoft's Windows 7, 8, XP and Vista, and Windows Phone 8 operating systems. An echo canceller that uses the loopback signal does not need to model those nonlinear distortions that are introduced by the audio interface (as the audio interface is effectively removed from the echo path) and, therefore, echo leaks are not expected. However, the loopback signal is not available for all operating systems. Examples of operating systems without this loopback functionality are Android and iOS mobile operating systems. In the absence of a loopback reference signal, echo cancellation may fail and produce echo leaks—among others, it is one aim of the present disclosure to prevent or at least reduce such echo leaks.

Audio signals, such as substantially unprocessed speech captured by a microphone, typically have peak signal amplitudes that vary over time. That is, audio signals typically have power envelopes that vary over time. A power envelope of an audio signal is a characteristic of an audio signal x(t) that reflects variations in peaks in audio signal power $|x(t)|^2$. The power envelope of the audio signal can be obtained by low pass filtering of $|x(t)|^2$ (or a normalized version of $|x(t)|^2$) e.g. by taking a moving average (windowed average) of the signal power $|x(t)|^2$ or normalized signal power over a temporal window of suitable duration (see below).

The present disclosure realizes that an effect of dynamic range compression, when applied to a typical audio signal w(t), having a typically time-varying power envelope ENV$[|w(t)|^2|$ (where ENV[.] is a suitable low-pass filter such as a moving average function), e.g. substantially unprocessed speech, is to reduce variations in peak signal power, thereby smoothing (i.e. reducing variations in) the power envelope ENV$[|w(t)|^2]$ of that signal. That is, reducing the dynamic range using compression also results in a smoothing of the signal power envelope.

However, the disclosure further recognizes, when dynamic range compression (DRC), represented by a function B(.), is applied (e.g. by an audio interface) to an audio signal x(t) with an already sufficiently smooth power envelope ENV$[|x(t)|^2]$, that already smooth power envelope is substantially unaffected by the audio interface DRC B(.), meaning that the effect of the DRC B(.) on that audio signal x(t) is at most a substantially linear amplitude transformation of the signal power envelope ENV$[|x(t)|^2$; that is, a substantially linear scaling of the audio signal power envelope ENV$[|x(t)|^2|]\mapsto$ ENV $[|B(x(t))|^2]=c*$ENV$[|x(t)|^2]+\Delta$(t) where c is a constant and $\Delta$(t) is substantially zero. In a multiband scenario, this relationship becomes ENV$[|x_i(t)|^2]\mapsto$ ENV $[|B(x_i(t))|^2]=c*$ENV$[|x_i(t)|^2]+\Delta_i(t)$, where each i indicates a different filter bank bin and $\Delta_i(t)$ is substantially zero for each i.

The present disclosure further exploits this realization in the context of an audio signal processing device (e.g. user device) having a loudspeaker (or similar), a microphone (or similar), and an audio interface of the kind discussed above i.e. to which any audio signals generated by software on the device for output have to be supplied if they are to be output via the loudspeaker, and which subjects the supplied audio signals to 'involuntary' dynamic range compression B(.) which is not controllable by the software. Audio signals received via the microphone are subject to reference-based audio signal processing that makes use of a reference (e.g. echo cancellation as mentioned above and described in further detail below).

More specifically, the subject matter exploits the aforementioned realization by the software applying, in a pre-processing step, initial 'voluntary' nonlinear amplitude processing (e.g. initial DRC) to an incoming audio signal w(t) to modify its power envelope in the software domain, thereby generating a digital audio signal x(t) having a modified power envelope—that modified power envelope is sufficiently smooth to be substantially unaffected by the audio interface DRC B(.) (i.e. such that a power envelope match ENV$[|B(x(t))|^2]\approx c*$ENV$[|x(t)|^2]$ is achieved—see above), which can be achieved by making the initial DRC sufficiently aggressive (see below). By attenuating in the pre-process step, by applying the initial DRC to compress the signal, the delta effect ($\Delta$(t), above) of the unknown non-linear processing is expected to be a lot less.

In a multiband scenario, a match ENV$[|B(x_i(t)|^2]\approx c*$ENV$[|x_i(t)|^2]$ for each subband i may be achieved by separately applying DRC in each of the subbands i (multiband DRC). This may be optimized if the different subbands of known the audio interface's unknown processing are known, at least roughly, as an equivalent filterbank division can be performed in the software domain (i.e. to match the subbands of the multiband software DRC to those of the unknown processing).

In embodiments, DRC is applied which is sufficiently aggressive to make (unknown) processing further down the signal path not have a large delta effect in terms of attenuation.

In applying a sufficiently aggressive initial non-linear amplitude operation such as initial DRC (which may or may not be similar to that of the audio interface compression), the net effect on the modified power envelope after the audio interface has operated on it is small. As will become apparent in view of the following, the window over which the power envelope is defined, which defines a temporal scale on which the audio signal is substantially unaffected by the audio interface processing, can have a number of suitable durations which vary for different implementations and which are dependent on the nature of the signal processing being applied to the microphone signals. For instance, where the signal processing is echo cancellation, suitable durations are determined by a time scale of the echo canceller, and needs to be small enough to show differences that cannot be adapted to (e.g. because they are too abrupt) as a system gain change that is reflected in the microphone signals e.g. a system gain change which is too abrupt to be adapted to by the echo canceller as if it had resulted from moving the speaker and microphone closer or further apart (typically echo cancellers are able to adapt to a change like this).

For instance, for signal processing in the form of typical suppression-based echo cancellation, it is expected to be sufficient for the power envelope of the audio signal x(t) defined over a widow having an order of magnitude of hundreds of milliseconds (e.g. approximately 200 ms as a ballpark figure) to be substantially unaffected by the audio interface processing to achieve the desired effect. As will be appreciated in view of the following, these values are only intended to be exemplary and will vary depending on the nature of the echo suppression (discussed below).

In this context, the audio interface dynamic range compression can be considered a "fast acting automatic gain control", where "fast" means too fast for the audio signal processing (e.g. echo cancellation) to be able keep up with gain changes that would result in the absence of the initial dynamic range compression (e.g. changes which would be too fast for the echo canceller to adapt to and which could thus result in echo leaks). However, by applying the initial processing to match the input and output signal power envelopes, this prevents any such fast gain changes from occurring.

Because the audio signal x(t) is generated in the software itself, the software can be easily configured to provide the reduced-dynamic-range audio signal x(t) for use as the reference in the audio signal processing of microphone signals. And because the dynamic range of the audio signal x(t) is already sufficiently narrow when it is supplied to the audio interface, the echo path observed by that signal x(t) does not include any nonlinearities as a result of the audio interface DRC B(.)—that is, any inherent nonlinear characteristics of the audio interface (due to the DRC B(.)) are not manifested in the output of the audio interface B(x(t)), and therefore do not have to be accounted for when applying reference-based audio signal processing on microphone signals that pick up loudspeaker output.

That is, nonlinear amplitude differences between the reference and any echo component in the microphone signals (due to B(x(t)) being picked up when output via the loudspeaker) are reduced which, among other things, can simplify the audio signal processing.

The software generated signal x(t) and the outgoing audio signal from the audio interface B(x(t)) are considered to match when $\Delta(t)$ (or $\Delta_i(t)$ for each i) is sufficiently small that it does not significantly impact on the signal processing (e.g. small enough for the signal processing to be able to function correctly on the assumption of a linear relationship between the reference and echo components in the microphone signal). That is, in general, the specific criteria for matching signals is circumstance-dependent and depends, in particular, on the nature of the signal processing as applied to the microphone signals.

For example, where the signal processing is echo cancellation, the echo cancellation is simplified as nonlinear characteristic of the audio interface do not have to be modelled (as these characteristics are not manifested in the output B(x(t)) of the audio interface. Nonlinear characteristics of the initial software DRC also do not have to be modelled as the software DRC is effectively disposed before the modelled echo path due to the software-compressed signal x(t) being used as the reference.

In the case of echo cancellation, the power envelopes of the software generated signal x(t) and the outgoing audio signal from the audio interface B(x(t)) are considered to match when $\Delta(t)$ (or $\Delta_i(t)$ for each i) is sufficiently small to not cause significant artefacts in the echo cancellation process e.g. small enough to not cause echo leaks. Echo cancellers typically have some robustness to small nonlinearities in the echo path (to prevent small nonlinearities causing echo leaks), and in this case the envelopes are considered to match when the echo canceller is robust to $\Delta(t)$ (or $\Delta_i(t)$). For example, an echo suppressor may apply over suppression to provide this robustness, and in this case the signal envelopes are considered to match at least when $\Delta(t)$ (or $\Delta_i(t)$) is sufficiently small to be compensated for by the over suppression (discussed below).

The subject matter applies particularly, but not exclusively, to a situation in which the output B(x(t)) of the audio interface is not available to software on the user device (e.g. where there is no loopback signal available).

Figure 2:
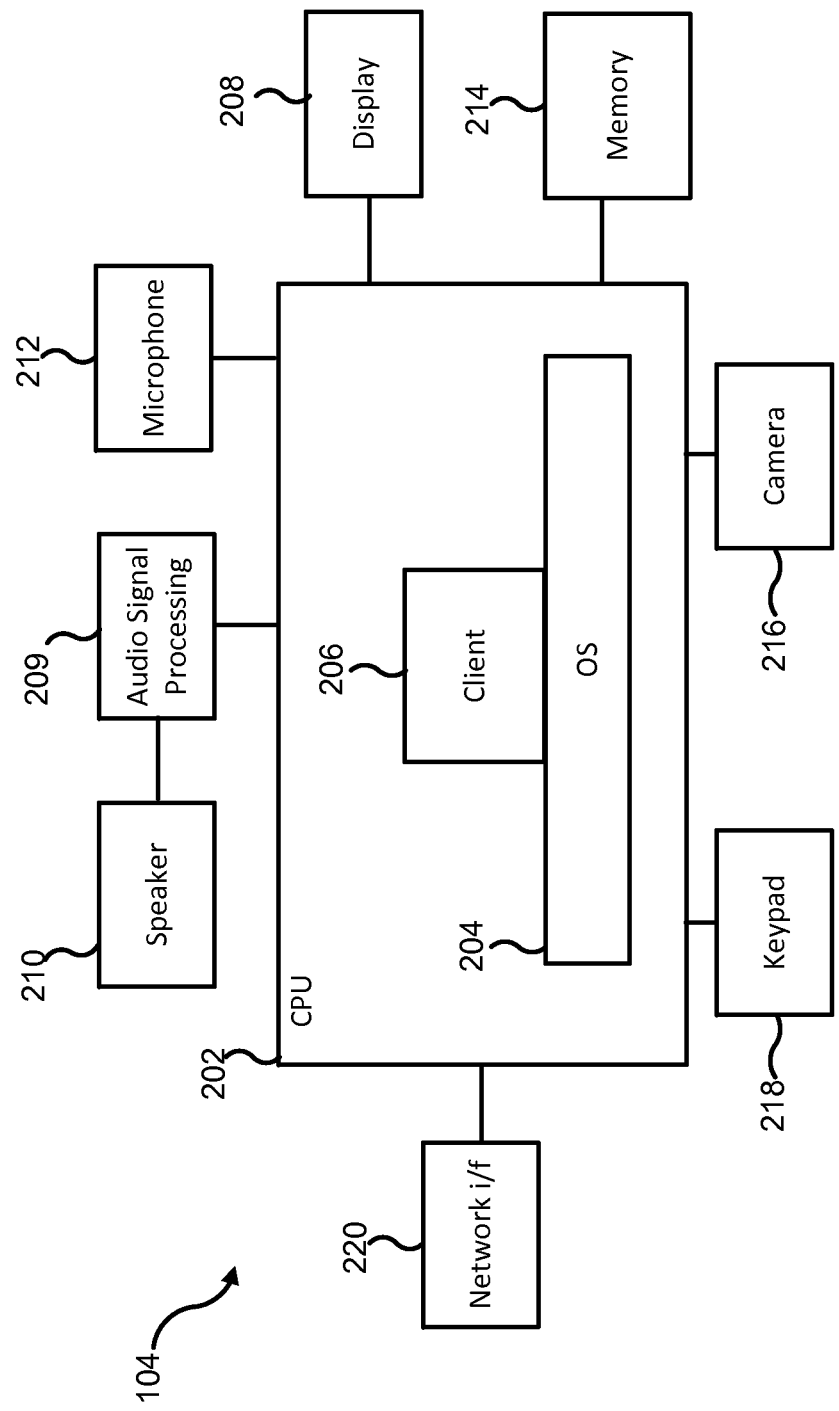
FIG. 2 is a schematic block diagram of a user device.

FIG. 2 illustrates a detailed view of the user device 104 on which is executed a communication client instance 206 for communicating over the communication system 100. The user device 104 comprises one or more central processing units ("CPU") 202, to which is connected: output devices such as a display 208, which may be implemented as a touch-screen, and a speaker (or "loudspeaker") 210 for outputting audio signals; input devices such as a microphone 212 for receiving audio signals, a camera 216 for receiving image data, and a keypad 218; a memory 214 for storing data; and a network interface 220 such as a modem for communication with the network 106. The speaker 210 is connected to the CPU 202 via an audio signal processing module 209. The user device 104 may comprise other elements than those shown in FIG. 2. The display 208, speaker 210, microphone 212, memory 214, camera 216, keypad 218 and network interface 220 may be integrated into the user device 104 as shown in FIG. 2. In alternative user devices one or more of the display 208, speaker 210, microphone 212, memory 214, camera 216, keypad 218 and network interface 220 may not be integrated into the user device 104 and may be connected to the CPU 202 via respective interfaces. One example of such an interface is a USB interface. If the connection of the user device 104 to the network 106 via the network interface 220 is a wireless connection then the network interface 220 may include an antenna for wirelessly transmitting signals to the network 106 and wirelessly receiving signals from the network 106.

FIG. 2 also illustrates an operating system ("OS") 204 executed on the CPU 202. Running on top of the OS 204 is the software of the client instance 206 of the communication system 100. The operating system 204 manages the hardware resources of the computer and handles data being transmitted to and from the network 106 via the network interface 220. The client 206 communicates with the operating system 204 and manages the connections over the communication system. The client 206 has a client user interface which is used to present information to the user 102 and to receive information from the user 102. In this way, the client 206 performs the processing required to allow the user 102 to communicate over the communication system 100. The OS 204 does not provide a loopback signal for use by the client 206 in this example.

The CPU 202 also executes driver software (not shown) which provides a software interface to the audio signal processing module 209. Any audio data generated for output on the user device 140 (e.g. by the client and other applications) must be supplied to the audio signal processing module 209 for processing is it is to be output via speaker 210.

Figure 3:
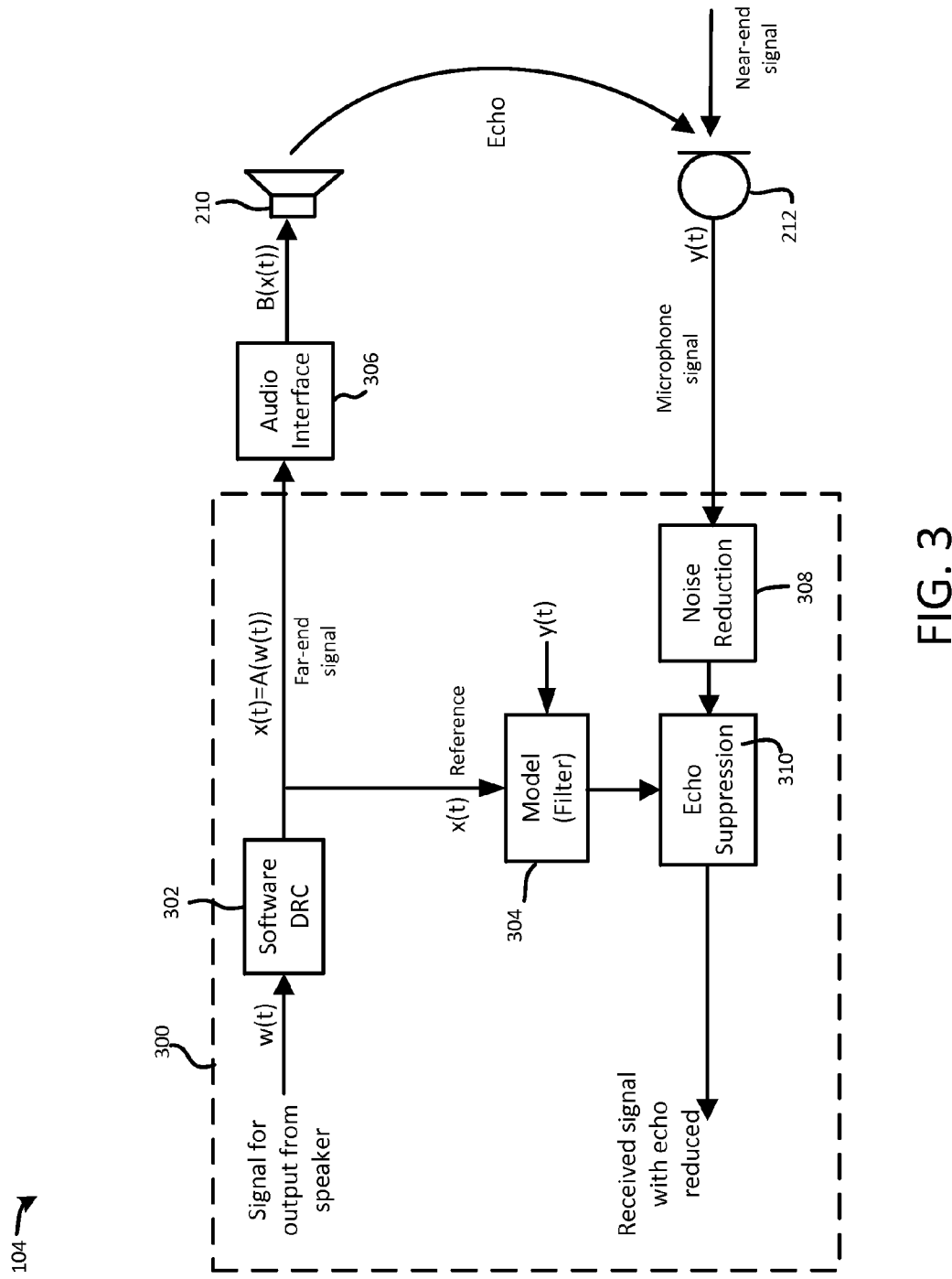
FIG. 3 is a schematic function diagram of an echo cancellation technique according to one embodiment.

With reference to FIG. 3 there is now described a method of echo cancellation. FIG. 3 is a functional diagram of a part of the user device 104.

As shown in FIG. 3, the user device 104 comprises an audio interface 306 which represents the combined functionality of the audio signal processing module 209 and associated driver software. The user device 104 further comprises the speaker 210, the microphone 212, and a signal processing module 300. The signal processing module 300 (shown as the dashed box in FIG. 3) represents the signal processing functionality implemented by executing communication client application 206 on the CPU 202 of device 104. The signal processing module comprises a non-linear amplitude processing module in the form of a dynamic range compression (DRC) module 302, a modelling module 304 comprising a filter module, a noise reduction module 308, and an echo cancellation module which is an suppression module 310 implementing echo suppression in this embodiment, but which may alternatively or additional implement echo subtraction in other embodiments. The signal processing functionality implemented by executing communication client application 206 may include more or less functionality than that shown in FIG. 3.

To model the echo path gains and estimate the echo captured by a microphone, a reference signal is needed which is the signal labelled x(t). This signal represents a processed version of an audio signal w(t) (processed by the compression module 302) that a communication client sends (via network 106) for playing out from a speaker, and which undergoes subsequent processing by the audio interface 306 outside of the software client domain before it can be output via the loudspeaker 210.

As indicated above, that further processing by the audio interface includes (further) dynamic range compression which is outside of the control of the signal processing module 300.

An incoming audio signal w(t) to be output from the speaker 210 is coupled to an input of the DRC module 302. The signal processing module 300 is coupled to the audio interface 306. In particular, an output x(t)=A(w(t)) (denoted "far-end signal") of the gain module 303 is coupled to an input of the audio interface 306. The output of the gain module 302 is also coupled to a first input of the modelling module 304. An output of the audio interface 306 is coupled to the speaker 210. It should be noted that in the embodiments described herein there is just one speaker (indicated by reference numeral 210 in the figures) but in other embodiments there may be more than one speaker to which the signal to be outputted is coupled (for outputting therefrom). Similarly, in the embodiments described herein there is just one microphone (indicated by reference numeral 212 in the figures) but in other embodiments there may be more than one microphone which receives audio signals from the surrounding environment. An output y(t) of the microphone 212 is coupled to the signal processing module 300. In particular, the output y(t) of the microphone 212 is coupled to an input of the noise reduction module 308. The output y(t) of the microphone 212 is also coupled to a second input of the modelling module 304. An output of the modelling module 304 is coupled to a first input of the echo suppression module 310. An output of the noise reduction module 308 is coupled to a second input of the echo suppression module 310. An output of the echo suppression module 310 is used to provide the received signal (with echo cancellation having been applied) for further processing in the user device 104.

Here, the function "A(.)" is a pre-process operator that applies dynamic range compression (e.g. maximization); that is, "A(.)" represents the function performed by the DRC module 302 in generating the output x(t)=A(w(t)). The audio signal x(t) is the signal used as the echo cancellation reference, and is also sent to the drivers (i.e. to the audio interface) for play out.

Figure 4:
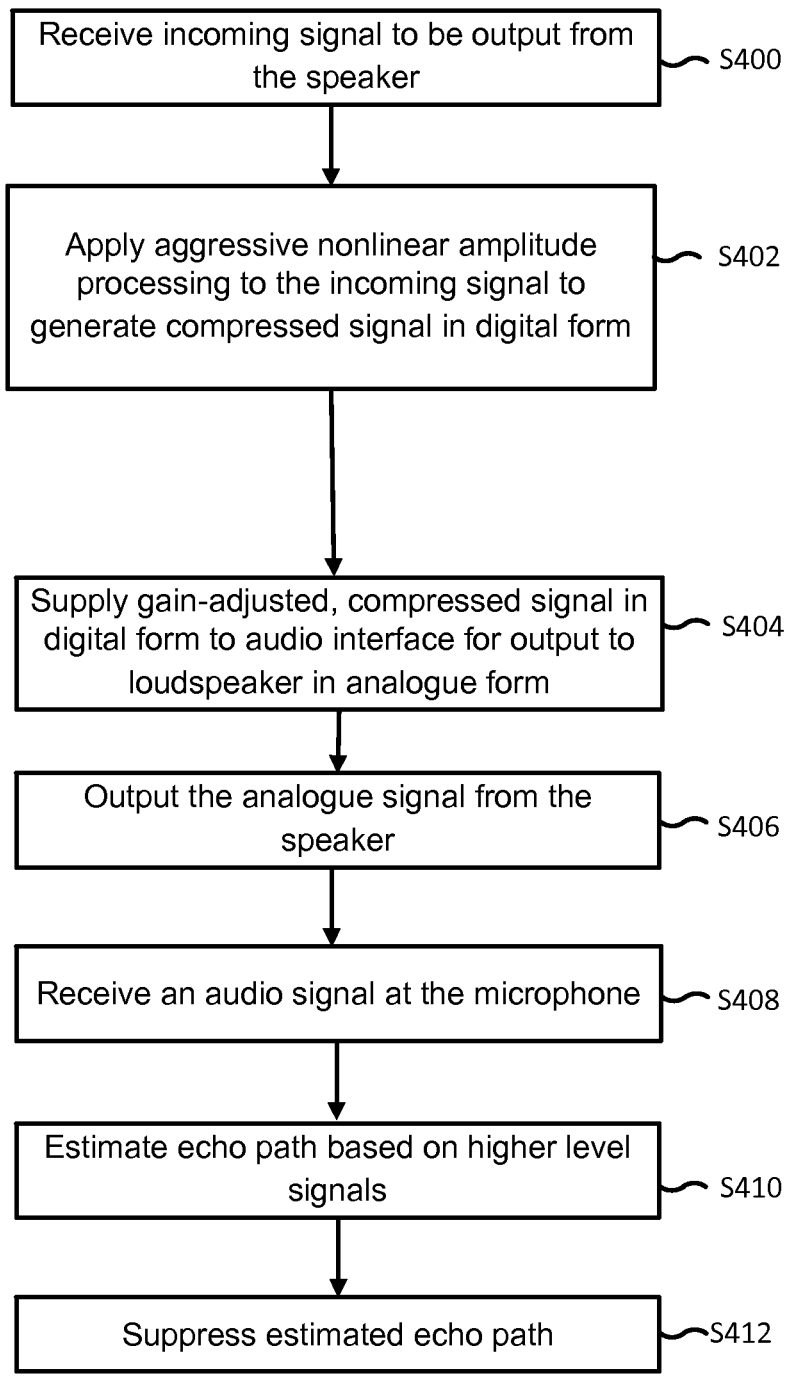
FIG. 4 is a flow chart for an echo cancellation process.

FIG. 4 is a flowchart for a process of the signal processing module 300.

In step S400 an incoming audio signal w(t) is received which is to be outputted from the speaker 210. For example, the signal to be outputted may be a far-end signal that has been received at the user device 104 at network interface 220 from the user device 110 during a call between the users 102 and 108 over the communication system 100. In other embodiments, the signal to be outputted may be received from somewhere other than over the communication system 100 in a call. For example, the signal to be outputted may have been stored in the memory 214 and step S400 may comprise retrieving the signal from the memory 214.

In step S402, the software DRC compression module 302 applies initial dynamic range compression—represented by the function A(.)—to the incoming audio signal w(t) to reduce its dynamic range, thereby generating an audio signal x(t)=A(w(t)) having a reduced dynamic range (that is, a compressed audio signal). The compressed audio signal x(t)=A(w(t)) is generated at the application software level (by the client application 206) in digital form.

In embodiments, the initial dynamic range compression may constitute a downward compression function and/or upward compression function performed on the incoming audio signal w(t), whereby louder parts of the incoming signal w(t) are reduced relative to quieter parts by applying a level-dependent gain to the incoming signal w(t).

Figure 5A:
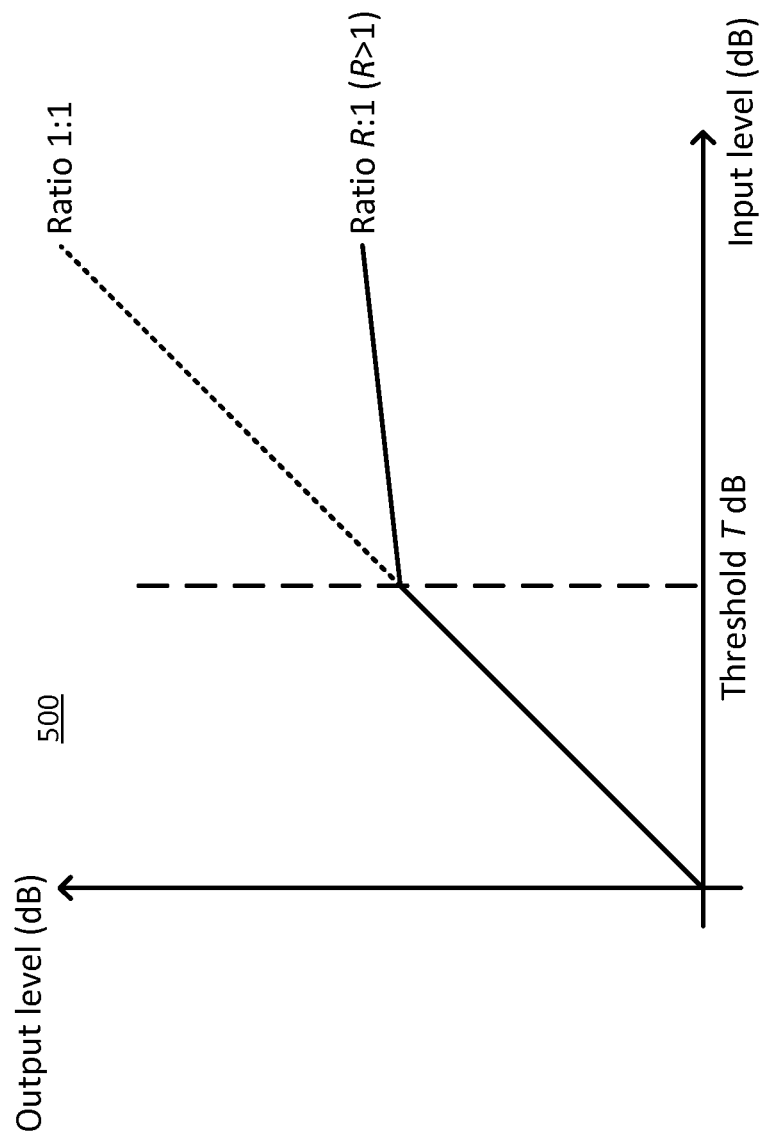
FIG. 5A is a schematic representation of a dynamic range downward compression function.

An example of a downward compression function is illustrated a graph 500 of FIG. 5A. The downward compression function is performed on an input signal (w(t) when implemented by the DRC module 302) to generate an output signal (x(t) when performed by the DRC module 302) having a narrower dynamic range than the input signal. The graph 500 shows the output signal level in dB ("decibels") as a function of the input signal level in dB. The downward compression function has parameters in the form of a threshold value T and a ratio R:1 (R≥1) which determine the nature and the extent of the downward compression in the following manner.

As illustrated in FIG. 5A, for each (temporal) portion of the input signal having a level below the threshold level T, the level of that portion is substantially unaffected by the downward compression. That is, below the threshold, the level-dependent gain has a constant value of substantially 0 dB (equivalent to a gain of 1 in the linear domain).

In contrast, for each (temporal) portion of the signal having a level above the threshold T, the level of that portion is attenuated by an amount which is determined by the ratio R:1. Specifically, for a particular portion of the input signal having a particular level IN which exceeds the threshold T, that particular portion is attenuated to have a reduced level of $$T\text{dB} + \frac{1}{R} * (IN\text{dB} - T\text{dB}).$$

That is, attenuated by an amount $$\left(1 - \frac{1}{R}\right) * (IN\text{dB} - T\text{dB})$$

in dB (which is level dependent in that the amount of attenuation depends on the input level IN).

The compression has an aggressiveness that is effected, at least in part, by the threshold and ratio values. The aggressiveness of dynamic range compression means the extent to which the dynamic range of the output audio signal is reduced relative to the dynamic range of the input signal—lower (resp. higher) thresholds and higher (resp. lower) ratios effect more (resp. less) aggressive dynamic range compression.

Figure 5B:
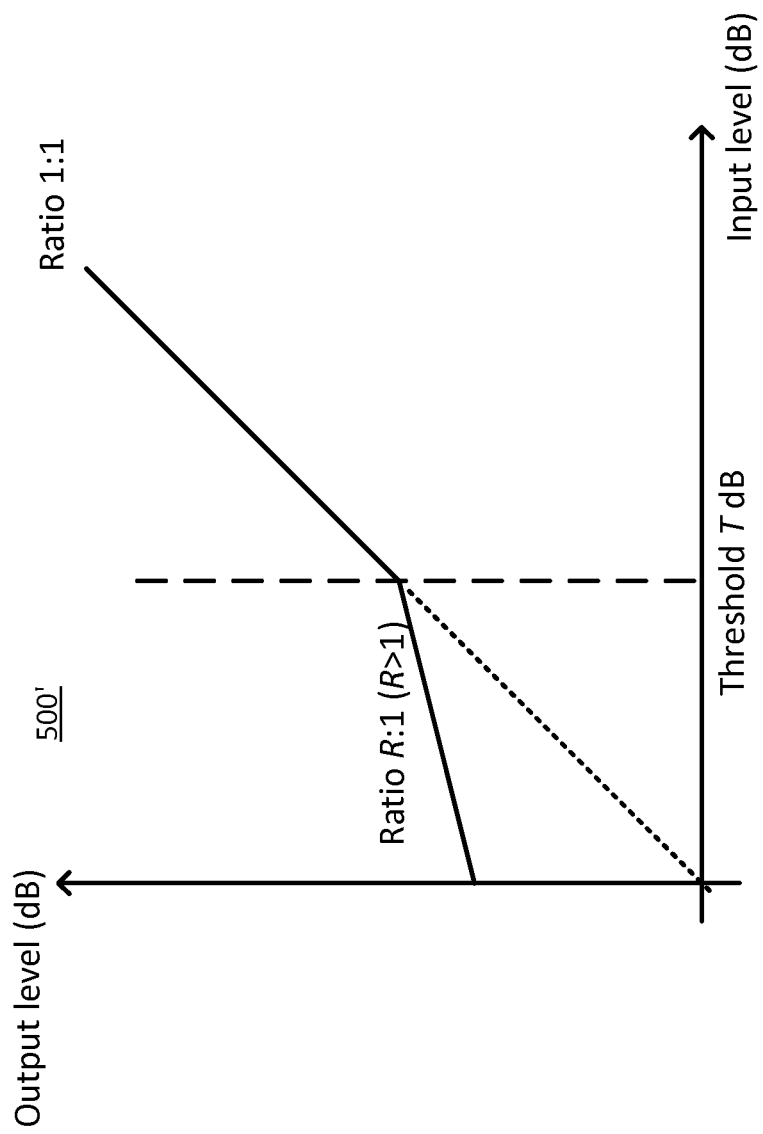
FIG. 5B is a schematic representation of a dynamic range upward compression function.

An example of an upward compression function is illustrated a graph 500' of FIG. 5B. The upward compression function is also performed on an input signal (w(t) when implemented by the DRC module 302) to generate an output signal (x(t) when performed by the DRC module 302) having a narrower dynamic range than the input signal. The graph 500' shows the output signal level in dB ("decibels") as a function of the input signal level in dB. The upward compression function also has parameters in the form of a threshold value T and a ratio R:1 (R≥1) which determine the nature and the extent of the downward compression in the following manner. However, in contrast to the downward compression of FIG. 5B, for each (temporal) portion of the input signal having a level above the threshold level T, the level of that portion is substantially unaffected by the upward compression. That is, above the threshold, the level-dependent gain has a constant value of substantially 0 dB (equivalent to a gain of 1 in the linear domain). For each (temporal) portion of the signal having a level below the threshold T, the level of that portion is boosted by an amount which is determined by the ratio R:1. Specifically, for a particular portion of the input signal having a particular level IN which is below the threshold T, that particular portion is boosted to have a increased level of $$T\text{dB} + \frac{1}{R} * (T\text{dB} - IN\text{dB}).$$

Here, the "dynamic range" of an audio signal a(t) (e.g. A(x(t)) refers to the difference between the louder and quieter parts of that audio signal a(t) and can be quantified, for instance, in terms of statistical measures applied to the audio signal a(t) or power envelop $ENV[|a(t)|^2|]$ e.g. a (moving) standard deviation, a (moving) norm of the difference of the curves etc.

As will be appreciated, there are just examples of a simple dynamic compressors. Alternative compressors may be parameterised by further parameters such as an attack time (which determines the speed at which the compressor responds to attenuate the input signal once the level of that signal begins to exceed the threshold), a release time (which determines the speed at which the compressor returns to a gain of 0 dB once the signal level drops below the threshold), and/or a knee (which acts to smooth the transition from the no attenuation region below the threshold to the level-dependent attenuation region above the threshold. The aggressiveness of the compression can be increased (resp. reduced) by decreasing (resp. increasing) the attack or release time, and/or by decreasing (resp. increasing) the knee.

Moreover, alternatively or additionally the compressor may be a multiband compressor whose, wherein two or more frequency components in two or more respective frequency bands of the signal are compressed separately from one another—in this case, a respective amount of gain is applied to each signal based on the level of that frequency component. For each frequency component, there may be an individual respective threshold and/or ratio (and/or other parameters) which determine(s) the gain to be applied that frequency component, or the same parameters may be used for different frequency components.

In one embodiment, the software DRC constitutes a maximizer which applies an amount of gain to the signal w(t), that amount being dependent on the level of the signal w(t), with an aggressiveness having an order of magnitude 10 ms (which would be considered very aggressive).

In this context, the aggressiveness refers to a time constant τ of the software DRC (e.g. maximizer). The time constant determines how fast the software DRC reacts by changing the level-dependent gain it is applying to a change in signal level of the signal w(t) (adaptation time). For example, where the level of w(t) changes by $\delta_1$ causing an eventual change in the level dependent DRC gain of $\delta_2$, for a software DRC with time constant τ, it would take approximately τ for the level dependent gain to change by $$\left(1 - \frac{1}{e}\right) * \delta_2$$

i.e. to achieve a fractional change of approximately 63%.

As will be appreciated, the 10 ms order-of-magnitude is a ballpark figure which, as discussed, will have significant dependence on the nature of the signal processing (e.g. echo cancellation) in practice. As will be appreciated, in practice, the aggressiveness of the software DRC could be suitably tuned at the design stage as part of normal design procedure.

In embodiments, the initial (software) dynamic range compression may have a time constant shorter than that of the dynamic range compression applied by the audio interface. That is, the initial dynamic range compression may be faster than that of expected types of audio interface processing intended to be negated. This has the effect of smoothing the power envelope of x(t) relative to w(t) on a temporal scale that is shorter than the response time of the audio interface processing, helping to ensure that x(t) is substantially unaffected by that interface processing.

In step S404, the far-end signal x(t) is supplied to the audio interface 306 which performs digital to analogue conversion (DAC) of the far-end signal, thereby generating an outgoing audio signal in analogue form for supplying to the loudspeaker 210.

As indicated, in generating the outgoing audio signal at S404, the audio interface 306 applies its own (further) dynamic range compression to the already-compressed far-end signal x(t) (already compressed by the DRC module 302), that further DRC being outside of the control of the client application 206 in this embodiment.

For instance, the audio interface may also implement a downward dynamic range compression function as illustrated in FIG. 5 (with x(t) as the input signal and B(x(t)) being the output signal), with its own threshold and ratio (and/or other parameters, frequency bands etc.).

However, as indicated, the tuning of the initial DRC applied at S402 is sufficiently aggressive to generate the compressed audio x(t) with a sufficiently narrow dynamic range that is substantially unaffected by the DRC as applied by the audio interface 306. Therefore, in spite of the fact that the audio interface is applying its own DRC to the already-compressed that is outside of the control of the client 206, no nonlinearities are actually introduced into the echo path as observed by x(t) in practice.

This is illustrated schematically in FIGS. 6A and 6B, which illustrate exemplary, idealized cases. FIG. 6A represents a scenario in which no software DRDC 304 is used, and in which the incoming audio signal w(t) is used directly as both the reference and the input to the audio interface 306. FIG. 6A shows power envelopes 602, 604 (e.g. defined over a window of approximately 200 ms—see above) for the reference, which is w(t) in this scenario, and the audio interface output, which is an outgoing signal B(w(t)) in this scenario, respectively. As can be seen in FIG. 6A, these power envelopes have respective shapes that vary significantly. In particular, the power envelope 602 of w(t) is substantially less smooth (i.e. exhibits substantially more variation) than the power envelope of B(w(t)).

In contrast, FIG. 6B illustrates a the above-described scenario of the present disclosure in which the software DRC 304 is used to generate the compressed signal x(t) which is used as both the reference and the input to the audio interface 306. FIG. 6B shows power envelopes 606, 608 (e.g. defined over a window of approximately 200 ms—see above) for the reference x(t) (as opposed to w(t)) and the audio interface output B(x(t)) (as opposed to B(w(t))) respectively. As can be seen in FIG. 6B, in contrast to FIG. 7A, these power envelopes have respective shapes that substantially match. As indicated above, the power envelopes represent a moving window average of the signal power (or normalized signal power). Thus, where different signals have matching power envelopes, this expresses the fact that those signals match one another on a timescale defined by the window size. In the case of echo cancellation, the window size needs to be small enough to show difference that are too abrupt to be adapted to as a system gain change (that is, to abrupt to be adapted to as if they resulted from, say, moving the speaker 210 and microphone 212 closer/further apart).

Amplitude variations between the software-generated and outgoing audio signals may occur in higher frequency components of those signals which are not reflected in the power envelope of that signal (as this only reflects lower frequency components). However, typically, suppression based acoustic echo cancellers have some degree of over suppression for robustness sake (that is, they apply to a microphone signal an amount of echo suppression gain in excess of that which is theoretically necessary to remove the echo component from the microphone signal). Thus, in this context, a suitable window for defining the power envelopes would have a duration that is sufficiently small to ensure that amplitude fluctuations not reflected in the envelope are sufficiently small to be accounted for by the over-suppression.

The disclosure thus considers audio signal processing (e.g. echo suppression) that is robust to amplitude differences between higher frequency components of the software-generated audio signal (the reference) and the outgoing audio signal that are not reflected in the power envelopes, but which is not robust to amplitude differences between lower frequency components which would be reflected in the power envelopes if present. Thus, it is sufficient to match the power envelopes of the signals as this substantially eliminates the latter without giving unnecessary consideration to the former.

In tuning the software DRC 302 e.g. as part of the software design process, a general model can be assumed where aggressive boosted attenuation is applied in the pre-process step without any knowledge of the DRC performed by the audio interface 306 (as in the above).

However, in embodiments, the general model can be enhanced by modelling, or otherwise detecting/inferring characteristic (e.g. parameters) of, the audio interfaces own nonlinear processing (DRC). The objective is to build a model which makes the change of the signal negligible—as will be appreciated, this can be achieved in a variety of ways.

That is, although the client 206 cannot exert control over the dynamic range compression applied by the audio interface 306, some embodiments provide means by which the client can at least determine information about the nature of the DRC applied by the audio interface, and then automatically tune the software DRC module in a live scenario at S402 (e.g. once the client has been installed on the user device 104 and instantiated on the processor 202).

Figure 3A:
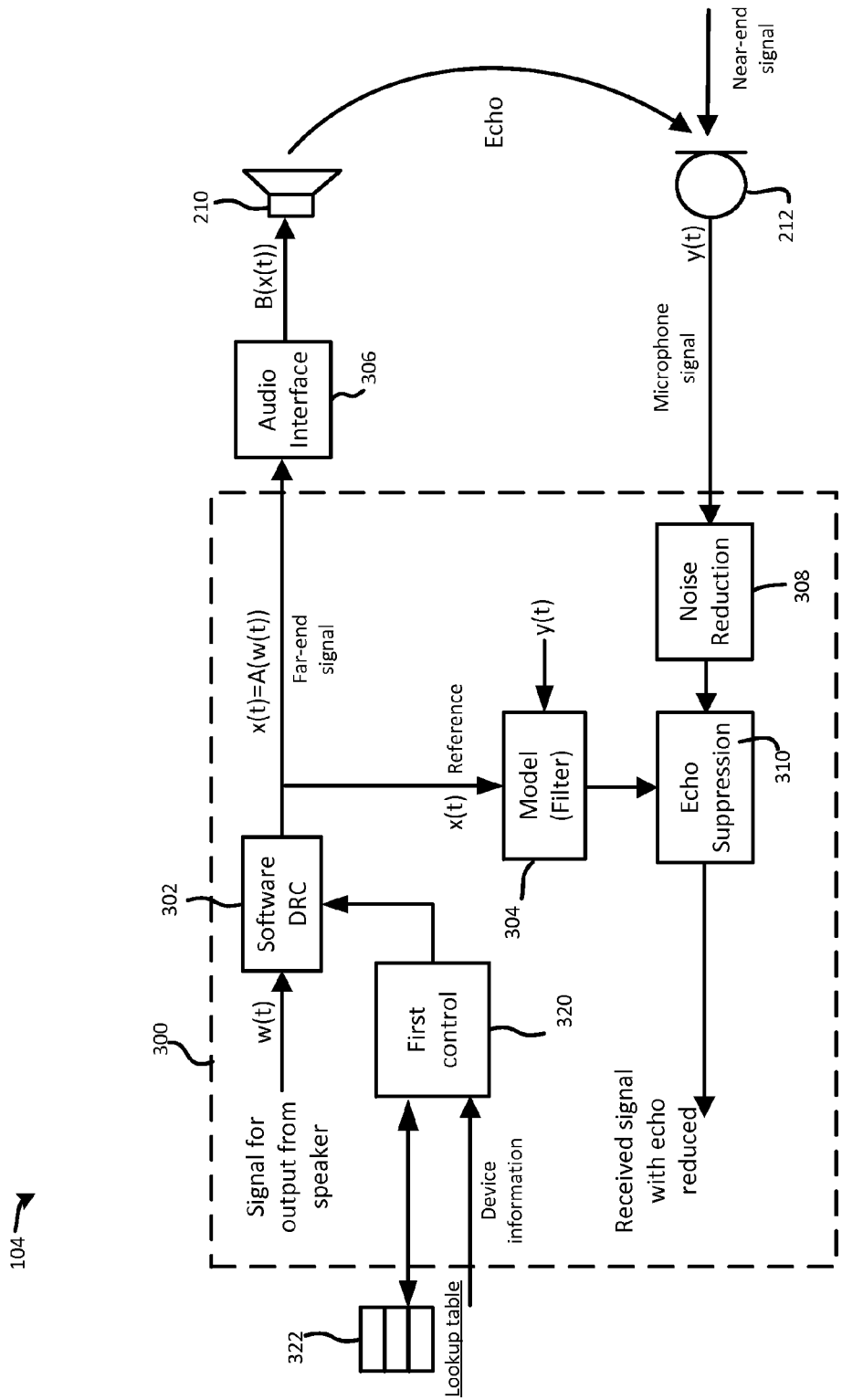
FIG. 3A is a schematic function diagram of an echo cancellation technique according to another embodiment.

In one such embodiment illustrated schematically in FIG. 3A, a lookup table 322 is stored in a manner accessible to the client 206, for instance in local memory 214 or in remote memory e.g. at a server and/or datacentre connected to the network 106 which the client 206 can access via the network 106. As shown in FIG. 3A, in this embodiment, the signal processing module (implemented by the client 106) comprises the same components as shown in FIG. 3A, and further comprises a first controller 320 for accessing the lookup table 312 and having an input configured to receive device information about the user device 104 on which the client 106 is executed. In this embodiment, the software DRC module 302 has a first additional input connected to an output of the first controller 320, by which the first controller 320 can configure parameters (such as those mentioned above) of the DRC module 302.

In operation, the first controller 320 may for instance be configured upon execution of the client 206 on the user device 104 to request the device information from the operating system 204. This information may be stored in memory 214 in a way that is accessible to the OS 204. Alternatively, the stored information may be accessible to the client 106 directly. The device information may, for instance, comprise one or more of an identifier of a manufacturer of the device and a model number of the device, information about the audio interface hardware (e.g. manufacturer and model IDs), audio interface drivers (e.g. driver version number) etc.

Figure 7:
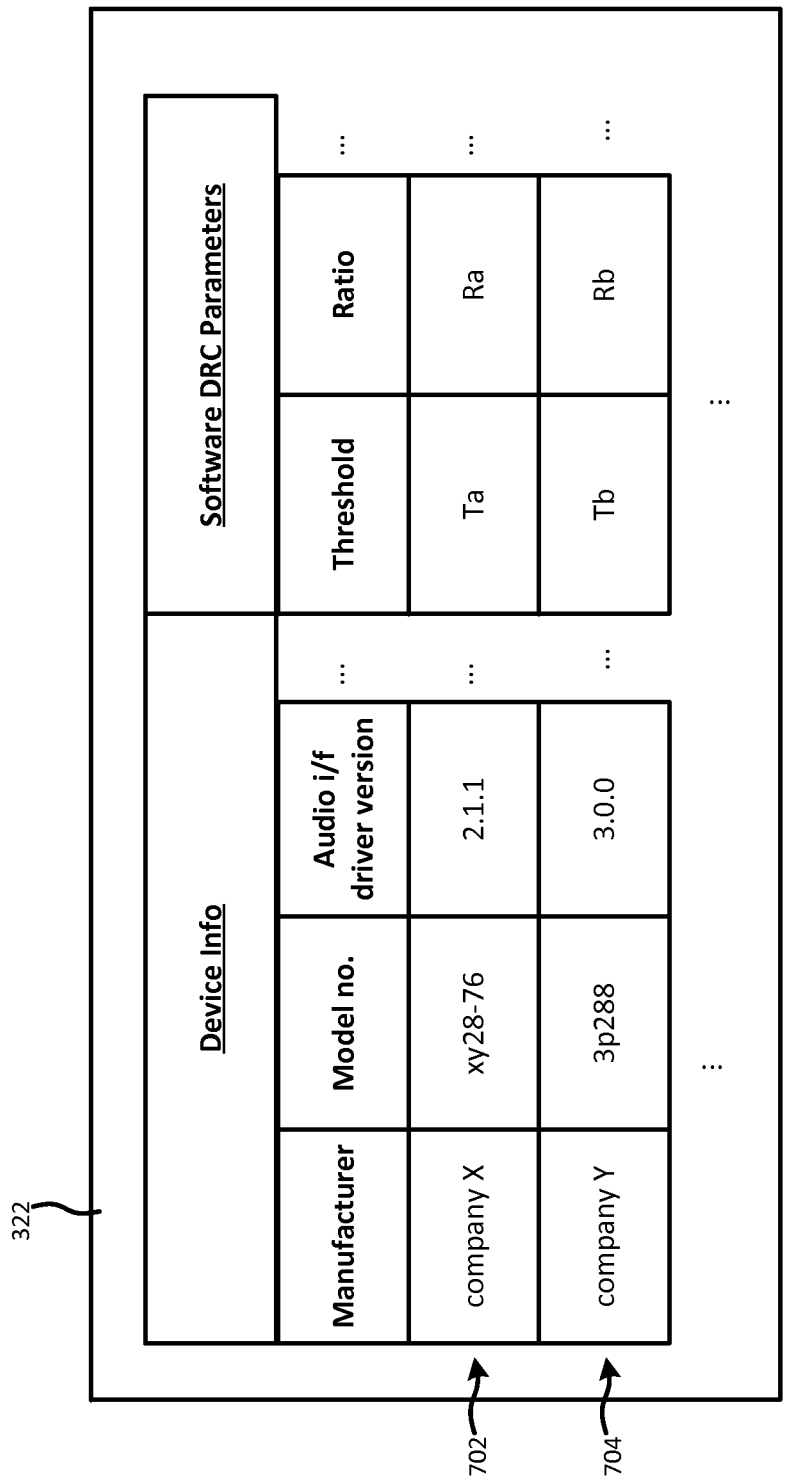
FIG. 7 is a schematic illustration of a lookup table.

As shown in FIG. 7, the lookup table 322 comprises a plurality of associations 702, 704 each associating one or more pieces of device information to a set of one or more parameters values for tuning the DRC module 320 (e.g. threshold and/or ratio values etc.).

The first controller 320 determines from the lookup table 322, based on the received device information, the associated set of DRC parameter values and configures the parameters of the DRC module 302 to those values (e.g. setting the threshold to the associated threshold value, setting the ratio to the associated ratio value etc.).

The lookup table 322 can be compiled 'offline' for instance by a software designer running the client on different device models manufactured by different manufacturers, manually tuning the parameters of the DRC module 302 to achieve the desired results, and recording optimized parameters in the lookup table 312 for 'online' use. The lookup table can be updated over time, and updates can be distributed e.g. as part of a client software update, or to the appropriate server(s) in the case that the table is access remotely.

Figure 3B:
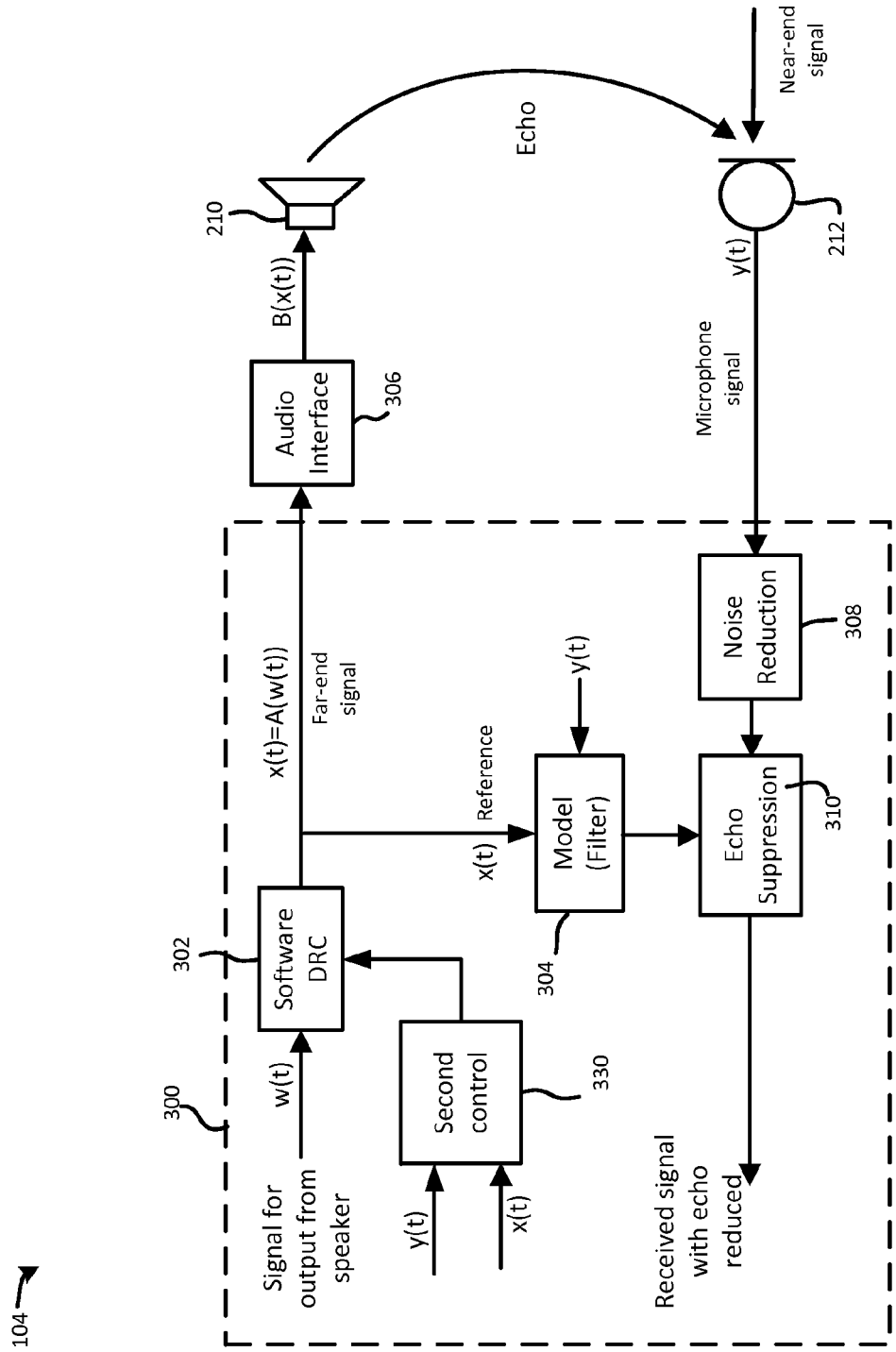
FIG. 3B is a schematic function diagram of an echo cancellation technique according to yet another embodiment.

In another such embodiment, the client 206 is configured to detect properties of the audio interface—e.g. to detect how much DRC (if any) it is applying to the far-end signal—for instance, by comparing the far-end signal x(t) supplied to the audio interface to the microphone signal y(t). As shown in FIG. 3B, in this embodiment, the signal processing module 300 comprises a second controller 330 having first and second inputs configured to receive the near-end signal x(t) and the microphone signal y(t). In this embodiment, the DRC compression module has a second additional input connected to an output of the second controller 330.

A process for detecting whether or not nonlinear amplitude processing (such as DRC) is present in a signal path, and for further detecting the amount of compression when present in that signal path, by way of signal comparison is described in the applicants co-pending UK patent application with application number GB 1321052.1. This process involves comparing first and second audio signals, the second audio signal being a processed version of the first, to detect a condition indicative of that processing of the first signal including dynamic range compression. This process is an example of a process that can be implemented by the second controller 330 with the far-end signal x(t) as the first signal and the microphone signal y(t) as the second signal, thereby enabling the second controller 302 to detect whether, and to what degree, compression has been added in the echo path by the audio interface 306.

In implementing the process of GB 1321052.1, the second controller exploits the fact that an amplitude distribution for a normalized version of the microphone signal y(t) will have a shape different from that of a corresponding amplitude distribution for a normalized version of the near-end signal x(t) whenever the dynamic range of the signal x(t) is further reduced by the audio interface 306, but that in contrast the shapes of these distributions will substantially match whenever the audio interface 306 does not alter the dynamic range of the signal x(t). Here, a normalized version of an audio signal means a version of that signal that has undergone audio normalization. Audio normalization is a process whereby signals are uniformly scaled in amplitude to have a common peak amplitude magnitude e.g. a predetermined peak magnitude of, say, 0 dBFS ("Decibels Relative to Full Scale), a technique known in the art.

As used herein, an "amplitude distribution" $D_{a(t)}$ for a signal a(t) (i.e. having an amplitude a(t) at time t) is defined over (spans) a set of values V, each value v∈V in the set V corresponding to one or more possible values of signal amplitude a (e.g. the set V being a set of signal amplitude values over which the distribution is defined, e.g. a range $[a_1, a_2]$, each value v∈V being a signal amplitude; the set V being a set of values of a function of the signal amplitude e.g. a range $[f(a_1), (a_2)]$ such as $[|a_1|, |a_2|]$). The distribution has a size $D_{a(t)}(v)$ for each value v∈V in the set V, that size pertaining to (for instance, being proportional to) an observed average rate at which amplitudes corresponding to that value v∈V appear in the signal a(t) (e.g. for a distribution $D_{a(t)}$ defined over a set of amplitude magnitudes $[|a_1|, |a_2|]$, the size of the distribution $D_{a(t)}(|a_n|)$ pertains to an observed rate at which amplitudes having magnitude $|a_n|$—which is both amplitudes $a_n$ and $-a_n$—occur in the signal a(t)). For a digitally sampled audio signal, the amplitude distribution may be a histogram $H_{a(t)}$ defined over a set values B, each value being a bin b∈B, each bin being a range of amplitude values b=$[|a_m|, |a_n|)$ (that is a range of amplitude magnitude values greater than or equal to $|a_m|$ but less than $|a_n|$), such that the histogram is defined over a set of such bins B={$b_1$=$[|a_1|, |a_2|)$, $b_2$=$[|a_2|, |a_3|)$, ... }, the histogram $H_{a(t)}$ having a size $H_{a(t)}(b)$ for each bin b∈B, that size pertaining to an observed average rate at which amplitudes occur in the signal a(t) having magnitudes in that bin b=$[|a_m|, |a_n|)$ (i.e. having magnitudes in the range $[|a_m|, |a_n|)$.) In this example, each bin (i.e. each value b of the distribution set B) corresponds to amplitudes having respective magnitudes in that bin b.

The parameters of the DRC module 302 are automatically tuned at S402 by the second controller based on the detected condition. For instance the aggressiveness of the initial software DRC could be increased until no DRC-type effects are observed in the echo path (i.e. until the shapes of the amplitude distributions more-or-less converge). Alternatively, the detected condition could be used as a binary on/off switch for the initial DRC (off when no audio interface DRC is detected, on otherwise), or to select one of several initial DRC models (e.g. of different levels of aggressiveness).

In step S406 the outgoing audio signal that has been processed by the audio interface 306 is outputted from the speaker 210. In this way the outgoing audio signal that has been processed by the audio interface 306 is outputted to the user 102.

In step S408 the microphone 212 receives an audio signal. As shown in FIG. 3 the received audio signal may include a near-end signal which is a desired signal or "primary signal". The near-end signal is the signal that the user 102 intends the microphone 212 to receive (labelled as near-end in FIG. 3)—e.g. speech. However, the received audio signal also includes an echo signal resulting from the audio signals outputted from the speaker 210 in step S406. The received audio signal may also include noise, such as background noise (not shown). Therefore, the total received audio signal y(t) can be given by the sum of the near-end signal, the echo and the noise. The echo and the noise act as interference for the near-end signal. Although not shown in FIG. 3, analogue to digital (ADC) conversion is applied to the signal captured by the microphone 212 to arrive at the digital signal y(t).

The modelling module 304 takes as inputs the output x(t) of the signal processing module 300 (far-end, compressed signal) and the received audio signal y(t). In step S410, the modelling module 304 is used to model an echo path of the echo in the received audio signal y(t).

The echo path describes the effects of the acoustic paths travelled by the audio signals output from the speaker 210 to the microphone 212. The audio signal may travel directly from the speaker 210 to the microphone 212, or it may be reflected from various surfaces in the environment of the near-end terminal. The echo path traversed by the audio signal output from the speaker 210 may be regarded as a system having a frequency and a phase response which may vary over time.

In order to remove the acoustic echo s(t) from the signal y(t) recorded at the near-end microphone 212 it is necessary to estimate how the echo path changes the desired far-end speaker output signal to an undesired echo component in the input signal.

The echo path modelling assumes an approximately linear echo path in this case i.e. assumes that output signal amplitude of the echo path scales linearly with input signal amplitude of the echo path—this assumption is more likely to hold due to the effect of the DRC module 302 as that DRC module significantly reduces the likelihood of the audio interface 306 introducing nonlinearities in the echo path observed by the compressed signal x(t) (see above).

For an approximately linear echo path the echo path h(t) describes how the echo in the received audio signal y(t) relates to the far-end signal x(t) output from the speaker 210, e.g. for a linear echo path represented by the impulse response h(t) according to the equation: $s(t)=\Sigma_{n=0}^{N_{true}} h_n(t) x(t-n)$, where s(t) is the echo in the received audio signal y(t), $N_{true}$ is the number of samples of the outputted far-end signal x(t) which are received by the microphone 212 and $h_n(t)$ are the coefficients of the impulse response describing the echo path h(t). The echo path h(t) may vary in both time and frequency and may be referred to herein as h(t) or h(t,f). The echo path h(t) may depend upon (i) the current environmental conditions surrounding the speaker 210 and the microphone 212 (e.g. whether there are any physical obstructions to the passage of the audio signal from the speaker 210 to the microphone 212, the air pressure, temperature, wind, etc.), and (ii) characteristics of the speaker 210 and/or the microphone 212 which may alter the signal as it is outputted and/or received, and (iii) any other process of the signal that might not be reflected in the far-end signal—in particular, due processing by the audio signal processing module 209 (but possibly also due to other factors e.g., buffer delays).

The filter module 304 models the echo path h(t) associated with the echo in the received audio signal y(t) by determining a weighted sum of the current and a finite number (N) of previous values of the outputted far-end signal x(t). The filter module 304 therefore implements an Nth order filter which has a finite length (in time) over which it considers the values of the outputted far-end signal x(t) in determining the estimate of the echo path ĥ(t). In this way, the filter module 304 dynamically adapts the filter estimate of the echo path $\hat{h}(t)$. The operation is described by the following equation, which defines the echo in the received audio signal y(t) in terms of the outputted far-end signal x(t): $\hat{s}_1(t)=\Sigma_{n=0}^{N}\hat{h}_n(t)x(t-n)$. Therefore N+1 samples of the outputted far-end signal x(t) are used, with a respective N+1 weights $\hat{h}_n(t)$. The set of N+1 weights $\hat{h}_n(t)$ is referred to herein simply as the estimate of the echo path $\hat{h}(t)$. In other words the estimate of the echo path $\hat{h}(t)$ is a vector having N+1 values where the filter module 304 implements an Nth order filter, taking N+1 values (e.g. N+1 frames) of the outputted far-end signal x(t) into account.

It can be appreciated that it is easier to adapt the filter estimate of the echo path $\hat{h}(t)$ when the echo is a dominant part of the received audio signal, that is when y(t)≈s(t). However, it may be possible to adapt the filter estimate of the echo path $\hat{h}(t)$ even when the echo is not a dominant part of the received audio signal y(t) if the echo s(t) is independent of the other signal components of y(t).

It will be appreciated by one skilled in the art that the estimate of the echo path $\hat{h}(t)$ does not need to be explicitly calculated, but could be represented by means of filter coefficients obtained from stochastic gradient algorithms such as Least Mean Squares (LMS), Normalized Least Mean Squares (NLMS), Fast Affine Projection (FAP) and Recursive Least Squares (RLS).

The estimate of the echo path $\hat{h}(t)$ is used to provide filter coefficients that filter the far-end signal to generate an estimate $\hat{s}_1(t)$ of the echo component in the microphone signal y(t) in accordance with the estimate of the echo path $\hat{h}(t)$. Regardless of the particular algorithm used, the filter coefficients of the filter module 304 are updated with each iteration of the algorithm, thus the coefficients of the filter module 304 are continually updated over time regardless of the signal conditions at hand.

Whilst the above description refers to the use of a time domain FIR model of the echo path to estimate the echo component in the near end signal y(t) it will be appreciated by those skilled in the art that this is just an example and not limiting in any way. That is, the filter module 304 may operate to determine an estimate of the echo path $\hat{h}(t)$ and thus an estimate $\hat{s}_1(t)$ of the echo component in the near end signal y(t) in the time domain or in the frequency domain.

Estimation of the echo path is typically based on high energy signals as those are the signals that produce the most reliable echo path estimates.

The noise reduction module 308 is arranged to lower the noise level of the microphone signal y(t) without affecting the speech signal quality of the microphone signal y(t). Various noise reduction techniques are known to persons skilled in the art for the purpose of eliminating noise. Spectral subtraction is one of these methods to enhance speech in the presence of noise. Spectral subtraction, uses estimates of the noise spectrum and the noisy speech spectrum to form a signal-to-noise (SNR) based gain function which is multiplied with the input spectrum to suppress frequencies having a low SNR. The aim of this process is to obtain an audio signal which contains less noise than the original.

A filter module in the modelling module 304 filters the far-end signal x(t) to generate an estimate of the echo component in the microphone signal y(t) in accordance with the estimate of the echo path.

The echo suppression module 310 is arranged to apply echo suppression to the high level portions of the received audio signal y(t). The purpose of the echo suppressor 310 is to suppress the loudspeaker echo present in the microphone signal, e.g. in a VoIP client, to a level sufficiently low for it not to be noticeable/disturbing in the presence of the near-end sounds (non-echo sounds) picked up by the microphone 212. Echo suppression methods are known in the art. Furthermore, the echo suppression method applied by the echo suppression module 310 may be implemented in different ways. As such, the exact details of the echo suppression method are not described in detail herein.

The echo suppression module 310 is arranged to receive as input the estimate of the echo component in the microphone signal $\hat{s}_1(t)$ and the microphone signal y(t) itself following noise reduction implemented by noise reduction module 308. The echo suppression module 310 is arranged to determine the power of the estimated echo and the power of the microphone signal y(t) following noise reduction. In the echo suppression module 310 the estimated echo power is used together with the determined power of the microphone signal y(t), and the output of the over-suppression factor estimation module 306 to form echo suppression gains G(t, f) for time t and frequency f. The echo suppression gain has the purpose of suppressing (at S414) any echo s(t) in the microphone signal y(t) to such a level that they are not noticeable.

The echo cancellation module 310 outputs the received signal, with the echo having been suppressed, e.g. for further processing on the device 104. For instance, the signal output from the echo suppression module 310 may be processed by the client 206 (e.g. encoded and packetized) and then transmitted over the network 106 to the user device 110 in a call between the users 102 and 108. Additionally or alternatively, the signal output from the digital gain control module 312 may be used for other purposes by the user device 104, e.g. the signal may be stored in the memory 214 or used as an input to an application which is executing at the user device 104.

Whilst in the above, the subject matter is used in the context of acoustic echo cancellation, in general the subject matter may be employed in the context of any audio signal processing that processes a microphone using a reference e.g. any audio signal processing processes the microphone signal based on an assumption of there being a linear relationship between the reference and at least a component of the microphone signal.

In the embodiments described above, the echo removal is implemented in a VoIP system (e.g. the received audio signal may include speech of the user 102 for transmission to the user device 110 during a call between the users 102 and 108 over the communication system 100). However, the methods described herein can be applied in any suitable system in which echo cancellation or other reference-based signal processing is to be applied.

The methods described herein may be implemented by executing a computer program product (e.g. the client 206) at the user device 104. That is, a computer program product may be configured to perform audio signal processing (e.g. echo cancellation) in an acoustic system comprising the user device 104. The acoustic system may further comprise at least one further user device. The computer program product is embodied on a computer-readable storage medium (e.g. stored in the memory 214) and configured so as when executed on the CPU 202 of the device 104 to perform the operations of any of the methods described herein.

In the above, there is disclosed an audio signal processing device having a loudspeaker component for outputting analogue audio signals and a microphone component for receiving analogue audio signals. The device comprises an audio interface. The audio interface is configured to receive in digital form any audio signal generated on the device for outputting via the loudspeaker component and to generate from the audio signal an outgoing audio signal in analogue form for supplying to the loudspeaker component. The audio interface is configured, in generating the outgoing audio signal, to apply dynamic range compression to the audio signal. The device further comprises a processor configured to execute software. The software is configured to receive an incoming audio signal and generate from the incoming audio signal an audio signal in digital form. The audio signal generated by the software is supplied to the audio interface for outputting by the loudspeaker component and is used as a reference in audio signal processing of audio signals received via the microphone component.

Generating the audio signal comprises the software applying initial nonlinear amplitude processing to the incoming audio signal to reduce its dynamic range, the audio signal thereby having a reduced dynamic range. The reduced dynamic range of the audio signal is sufficiently narrow to be substantially unaffected by the dynamic range compression when applied to the audio signal by the audio interface.

For instance, the initial processing may be initial dynamic range compression. The reduction of the dynamic range is an inherent outcome of the initial DRC, in addition to the desired effect of smoothing the power envelope.

Generally, any of the functions described herein (e.g. the functional modules shown in FIGS. 3, 3A and 3B and the functional steps shown in FIG. 4) can be implemented using software, firmware, hardware (e.g., fixed logic circuitry), or a combination of these implementations. The modules and steps shown separately in FIGS. 3, 3A, 3B and 4 may or may not be implemented as separate modules or steps. The terms "module," "functionality," "component" and "logic" as used herein generally represent software, firmware, hardware, or a combination thereof. In the case of a software implementation, the module, functionality, or logic represents program code that performs specified tasks when executed on a processor (e.g. CPU or CPUs). The program code can be stored in one or more computer readable memory devices. The features of the techniques described herein are platform-independent, meaning that the techniques may be implemented on a variety of commercial computing platforms having a variety of processors. For example, the user devices may also include an entity (e.g. software) that causes hardware of the user devices to perform operations, e.g., processors functional blocks, and so on. For example, the user devices may include a computer-readable medium that may be configured to maintain instructions that cause the user devices, and more particularly the operating system and associated hardware of the user devices to perform operations. Thus, the instructions function to configure the operating system and associated hardware to perform the operations and in this way result in transformation of the operating system and associated hardware to perform functions. The instructions may be provided by the computer-readable medium to the user devices through a variety of different configurations.

One such configuration of a computer-readable medium is signal bearing medium and thus is configured to transmit the instructions (e.g. as a carrier wave) to the computing device, such as via a network. The computer-readable medium may also be configured as a computer-readable storage medium and thus is not a signal bearing medium. Examples of a computer-readable storage medium include a random-access memory (RAM), read-only memory (ROM), an optical disc, flash memory, hard disk memory, and other memory devices that may us magnetic, optical, and other techniques to store instructions and other data.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. An audio signal processing device having a loudspeaker component for outputting analogue audio signals and a microphone component for receiving analogue audio signals, the device comprising:
   an audio interface configured to receive in digital form any audio signal generated on the device for outputting via the loudspeaker component and to generate from the audio signal an outgoing audio signal in analogue form for supplying to the loudspeaker component, the audio interface configured, in generating the outgoing audio signal, to apply dynamic range compression controlled by the audio interface to the audio signal; and
   a processor configured to execute software, the software configured to:
      receive an incoming audio signal;
      generate an audio signal in digital form by pre-processing the incoming signal including:
         detecting one or more characteristics of the dynamic range compression applied by the audio interface; and
         based on the detected characteristics, applying initial nonlinear amplitude processing controlled by the software to the incoming audio signal to modify its power envelope, the audio signal thereby having a modified power envelopep;
      provide the pre-processed audio signal as a reference in audio signal processing of audio signals received via the microphone component; and
      supply the pre-processed audio signal for additional processing by the audio interface prior to output via the loudspeaker component including the dynamic range compression applied by the audio interface, wherein the initial nonlinear amplitude processing controlled by the software results in smoothing of the power envelope thereby reducing effects of dynamic range compression applied by the audio interface.

2. An audio signal processing device according claim 1 wherein the initial nonlinear amplitude processing is initial dynamic range compression.

3. An audio signal processing device according to claim 2 wherein the initial dynamic range compression has a time constant of ten milliseconds.

4. An audio signal processing device according to claim 2 wherein the initial dynamic range compression has a time constant set to make initial dynamic range compression occur faster than the dynamic range compression applied by the audio interface.

5. An audio signal processing device according to claim 1 wherein the audio signal processing is based on an assumption of there being a substantially linear relationship between the reference and a component of the audio signals received via the microphone component.

6. An audio signal processing device according to claim 1 wherein the audio signal processing comprises applying acoustic echo cancellation to the audio signals received via the microphone component using the generated audio signal as the reference, thereby cancelling echo from those signals.

7. An audio signal processing device according to claim 1 wherein the audio interface comprises driver software executed on the processor; and
    wherein the incoming audio signal is received, and the audio signal generated, by an application executed on the processor, the generated audio signal being supplied to the driver software.

8. An audio signal processing device according to claim 1 comprising a network interface configured to access a communication network to receive the incoming audio signal.

9. An audio signal processing device according to claim 1 comprising computer storage and a first controller configured to retrieve at least one piece of device information about the device from the computer storage;
    wherein the first controller is configured to access a stored association associating the piece of device information with at least one nonlinear processing parameter, and to control the initial nonlinear amplitude processing based on that association.

10. An audio signal processing device according to claim 1 comprising a second controller configured to detect a characteristic of the dynamic range compression applied by the audio interface, and to control the initial nonlinear amplitude proceeding based on that detection.

11. An audio signal processing device according to claim 10, wherein the second controller is configured to detect the characteristic by comparing the audio signal and a microphone audio signal received via the microphone component.

12. At least one computer readable device storing software for execution on an audio signal processing device having a loudspeaker component for outputting analogue audio signals, a microphone component for receiving analogue audio signals, and comprising an audio interface configured to receive in digital form any audio signal generated on the device for outputting via the loudspeaker component and to generate from the audio signal an outgoing audio signal in analogue form for supplying to the loudspeaker component, the audio interface configured, in generating the outgoing audio signal, to apply dynamic range compression controlled by the audio interface to the audio signal;
    wherein the software is configured when executed to:
        receive an incoming audio signal and generate from the incoming audio signal an audio signal in digital form by pre-processing the incoming signal, the pre-processing including:
            detecting one or more characteristics of the dynamic range compression applied by the audio interface; and
            based on the detected characteristics, applying initial nonlinear amplitude processing controlled by the software to the incoming audio signal to modify its power envelope;
        supply the generated audio signal to the audio interface for additional processing by the audio interface prior to output via the loudspeaker component including the dynamic range compression applied by the audio interface, wherein the initial nonlinear amplitude processing controlled by the software results in smoothing of the power envelope thereby reducing effects of dynamic range compression applied by the audio interface; and
        provide the generated audio signal for use as a reference in audio signal processing of audio signals received via the microphone component.

13. At least one computer readable device according to claim 12, wherein the initial nonlinear amplitude processing is initial dynamic range compression.

14. At least one computer readable device according to claim 13 wherein the initial dynamic range compression has a time constant of ten milliseconds.

15. At least one computer readable device according to claim 13 wherein the initial dynamic range compression has a time constant set to make initial dynamic range compression occur faster than the dynamic range compression applied by the audio interface.

16. At least one computer readable device according to claim 12 wherein the additional audio signal processing is based on an assumption of there being a substantially linear relationship between the reference and a component of the audio signals received via the microphone component.

17. At least one computer readable device according to claim 12 wherein the audio signal processing comprises applying acoustic echo cancellation to the audio signals received via the microphone component using the using the generated audio signal as the reference, thereby cancelling echo from those signals.

18. At least one computer readable device according to claim 12, wherein the software is an application, and the generated audio signal is supplied by the application to driver software of the audio interface.

19. A software-implemented method performed in an acoustic system comprising a loudspeaker component for outputting analogue audio signals, a microphone component for receiving analogue audio signals, and an audio signal processing device comprising an audio interface configured to receive in digital form any audio signal generated on the device for outputting via the loudspeaker component and to generate from the audio signal an outgoing audio signal in analogue form for supplying to the loudspeaker component, the audio interface configured, in generating the outgoing audio signal, to apply dynamic range compression controlled by the audio interface to the audio signal, the method comprising:
    receiving an incoming audio signal and generating from the incoming audio signal an audio signal in digital form by pre-processing the incoming signal, the pre-processing including:
        detecting one or more characteristics of the dynamic range compression applied by the audio interface; and
        based on the detected characteristics, applying initial nonlinear amplitude processing controlled by the software to the incoming audio signal to modify its power envelope;
    supplying the generated audio signal to the audio interface for additional processing by the audio interface prior to output via the loudspeaker component including the dynamic range compression controlled by the audio interface, wherein the initial nonlinear amplitude processing controlled by the software results in smoothing of the power envelope thereby reducing effects of dynamic range compression applied by the audio interface; and
    providing the generated audio signal for use as a reference in applying acoustic echo cancellation to audio signals received via the microphone component, thereby cancelling echo from those signals.

20. A software-implemented method according to claim 19, wherein the additional audio signal processing is based on an assumption of there being a substantially linear relationship between the reference and a component of the audio signals received via the microphone component.

* * * * *